United States Patent [19]

Nagesh et al.

[11] Patent Number: 5,324,569
[45] Date of Patent: Jun. 28, 1994

[54] COMPOSITE TRANSVERSELY PLASTIC INTERCONNECT FOR MICROCHIP CARRIER

[75] Inventors: Voddarahalli K. Nagesh, Cupertino; Daniel J. Miller, San Francisco, both of Calif.; Robert A. Schuchard; Jeffrey G. Hargis, both of Fort Collins, Colo.

[73] Assignee: Hewlett-Packard Company, Palo Alto, Calif.

[21] Appl. No.: 23,526

[22] Filed: Feb. 26, 1993

[51] Int. Cl.$^5$ .................................. B32B 9/00
[52] U.S. Cl. ................... 428/198; 428/402; 428/403
[58] Field of Search ................. 428/198, 402, 403

[56] References Cited

U.S. PATENT DOCUMENTS

| | | | |
|---|---|---|---|
| 4,914,814 | 4/1990 | Behun et al. | 361/406 |
| 4,927,697 | 5/1990 | Ihill | 428/198 |
| 5,159,535 | 10/1992 | Desai et al. | 361/396 |
| 5,170,931 | 12/1992 | Desai et al. | 228/180.2 |
| 5,201,451 | 4/1993 | Desai et al. | 228/5.5 |

Primary Examiner—Patrick J. Ryan
Assistant Examiner—Kam F. Lee

[57] ABSTRACT

A composite transversely plastic interconnect for a microcarrier produces a carrier-to-substrate bond having low electrical resistance and high mechanical strength, significant bond height to mediate TCE mismatch between dissimilar carrier and substrate materials, and sufficient gap between the carrier and the substrate to permit effective post solder cleaning of the interconnect. A contact array consisting of solder balls is placed directly onto either of a carrier or a substrate interconnect surface with a stencil positioned to the chosen interconnect surface. The solder balls may have a selected melting temperature. Additionally, the solder balls may have a metallic coating, such as nickel or copper, or molten solder. The carrier and substrate are joined by mating an interconnect surface of each and applying heat. Solder paste may be applied to one of the interconnect surfaces to add additional height to the joint and compensate for lack of coplanarity between the carrier and the substrate.

7 Claims, 1 Drawing Sheet

COMPOSITE TRANSVERSELY PLASTIC INTERCONNECT FOR MICROCHIP CARRIER

BACKGROUND OF THE INVENTION

1. Technical Field

The present invention relates to integrated circuits. More particularly, the present invention relates to integrated circuit carriers.

2. Description of the Prior Art

Advances in integrated circuit technology continue to produce smaller and denser devices. As a result of such increased device density, the number of connections that may be made to an integrated circuit ("pin-out") has increased substantially, while the size of the integrated circuit has decreased substantially. Traditional approaches to integrated circuit packaging cannot accommodate these modern device pin-out densities. Accordingly, considerable effort is currently being expended to develop and improve integrated circuit packaging technologies.

One emerging packaging technology that is particularly promising is that of microcarriers. FIG. 1 is a partial plan view of a typical microcarrier 10, in which a carrier base 12 includes rows of terminals 14 to which an integrated circuit (not shown) is connected. An array of bump-shaped pads 16 provides a microcarrier pin-out. The microcarrier shown in FIG. 1 provides a microcarrier having a size of 2 cm (0.8 inches) per side, and a pin-out of 408 pads having a 0.6 mm (24 mil) pitch. Microcarriers presently available are capable of providing a pin-out array of up to 1000 pads having a 0.25 mm (10 mil) pitch.

In early microcarrier applications, an integrated circuit was wire bonded to the microcarrier. The microcarrier was then mounted onto a substrate, such as a printed circuit board, using area array solder joints. In more recent microcarrier applications, the microcarrier may be designed to accept integrated circuits having either high density TAB or area array flip chip solder bump connections, in addition to wire bonds.

Initially, microcarriers were made of alumina ceramics. Such microcarriers provided about 400 input/output terminals "I/O") in a package having dimensions of about 2.03 cm (0.8 inches) per side. This compares quite favorably with other packaging technologies, such as pin grid arrays, which have dimensions of about 5.08 cm (2 inches) per side.

When first introduced, ceramic microcarriers were mounted onto multiplayer ceramic substrates having matching pads by solder screen printing and IR reflow of the microcarrier/substrate assembly. Currently, microcarriers may be made of many different materials. For example, printed circuit board materials may be used for low cost applications having low to medium I/O count, whereas copper polyimide Cu/PI on ceramic (such as alumina, aluminum nitride, etc.) may be used for very high density, high performance applications.

A problem arises in microcarrier applications when dissimilar materials are used for the carrier and the substrate to which the carrier is attached because of the thermal coefficient of expansion ("TCE") mismatch between the dissimilar materials. Temperature cycling normally encountered under circuit operating conditions often results in some movement of the carrier and the substrate relative to one another. The use of standard area array soldering to join the carrier to the substrate produces a mechanical bond of insufficient strength to mediate a significant TCE mismatch. Thus, under conditions of thermal cycling, the solder joints between the carrier and the substrate may be broken, disrupting circuit operation and necessitating assembly repair.

When contact area is increased to strengthen the carrier-to-substrate bond enough to maintain the bond during thermal cycling, pin out density is decreased dramatically. For example, current practice permits solder joints between similar materials in which a contact area of 0.25 mm (10 mils) with a gap between contacts of 0.25 mm (10 mils) provides a contact array having a 0.50 mm (20 mil) pitch. When dissimilar materials are used for the carrier and substrate, a 1.0 mm (40 mil) contact must be provided, resulting in a contact array having a 1.25 mm (50 mil) pitch.

It is known that the height of the solder joint between the carrier and the substrate is critical in mediating severe TCE mismatch encountered when dissimilar materials are used for the substrate and the carrier. That is, a longer joint somewhat reduces the likelihood of failure at a solder joint under conditions of TCE mismatch. It is also known that the height of the solder joint is critical for effective cleaning of the solder joint after the joint is formed by heating. If effective cleaning is not performed at the solder joint, the residual corrosive materials remaining at the joint after soldering will attack the joint and eventually cause the joint to fail.

The height of the solder joint, i.e. the separation between the carrier and the substrate, may be increased by any of various known techniques. These techniques include making a post print of tungsten metal onto a bond surface of either the substrate or the carrier to raise the height of the interconnecting pads and thereby add height to a resulting solder joint; and the use of a stand-off or spacer, such as a metal pin or ball (e.g. made of tungsten or copper) at each interconnecting pad of the substrate or carrier.

Although post printing raises the solder pads a small amount, such that it is possible to compensate somewhat for a lack of coplanarity between the substrate and the carrier, it does not provide adequate height to mediate the TCE mismatch when dissimilar materials are used for the substrate and the carrier.

Metal pins provide a partial solution to the problem of adding height to a solder joint, but they are prohibitively expensive (currently about 15 times standard processing costs). Tiny metal balls that are useful as spacers between a substrate and a carrier are commercially available, for example from such well known vendors as Kester and Alpha Metals. Although such metal balls have been found to be of limited use to raise the height of the solder pads, the tendency of a substrate and a carrier to lack coplanarity requires that metal balls of various sizes be provided at different locations in a solder pad array to mate the interconnect surface of the carrier to that of the substrate. The metal balls must also be of sufficient strength to provide adequate support for heavier carriers such as those including multiple circuits, etc., when the metal balls are subjected to temperatures that are sufficient to produce a solder bond.

Presently, when using a microcarrier, a circuit designer is constrained to using a substrate and carrier formed of a similar material. This lack of choice limits the designer's ability to exploit the properties of various materials as an application may require. The full value of microcarriers will be realized when the limitations and problems their use poses are solved. The ability to attach a microcarrier to a substrate formed of a dissimilar material in a commercially and technically reasonable fashion would be a significant advance in the integrated circuit packaging art.

SUMMARY OF THE INVENTION

The present invention provides a composite transversely plastic interconnect for a microcarrier that allows a microcarrier and a substrate of dissimilar materials to be joined. The interconnect produces a bond having low electrical resistance and high mechanical strength, and provides significant bond height to mediate TCE mismatch between the dissimilar carrier and substrate materials, while allowing a sufficient gap between the carrier and the substrate to permit effective post solder cleaning of the interconnect.

In the preferred embodiment of the invention, a contact array consisting of metal balls is formed on either of a carrier or a substrate interconnect surface. In the preferred embodiment of the invention, the metal balls comprise a solder ball having a metallic coating, such as nickel or copper. The coating is of sufficient thickness, and has a high enough melting temperature, that the shape of the solder balls is maintained when heat is applied to the metal ball to form an interconnect bond. The present invention therefore allows the carrier and substrate to be joined by mating an interconnect surface of each and applying heat, while providing a significant interconnect gap. In the preferred embodiment of the invention, solder paste is applied to one of the interconnect surfaces for soldering purposes, to add yet additional height to the joint, and to compensate for any lack of coplanarity between the carrier and the substrate.

DETAILED DESCRIPTION OF THE INVENTION

Figure 1:
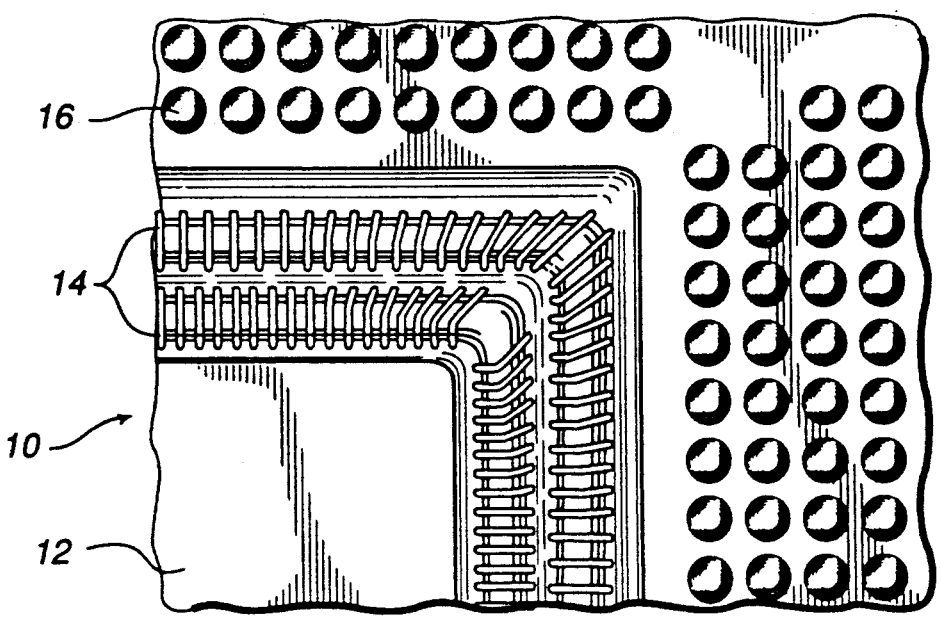
FIG. 1 is a partial plan view of a typical prior art microcarrier.

The present invention is best understood by referring to the Drawings in connection with review of this Description. The present invention provides a composite transversely plastic interconnect for a microcarrier that allows the joining of a microcarrier and a substrate made of dissimilar materials.

Figure 2:
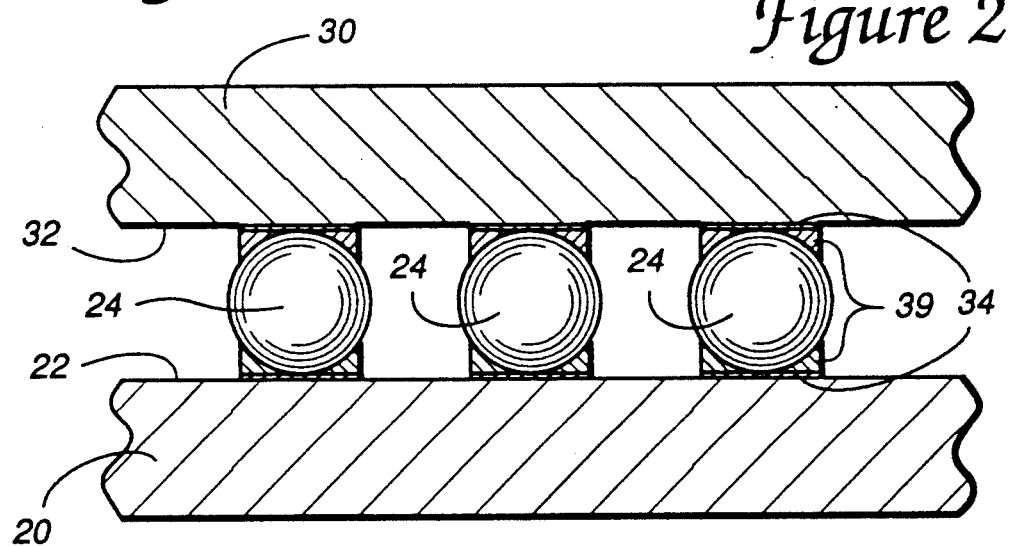
FIG. 2 is a cross sectional view showing a microcarrier and a substrate interconnected, one with the other, according to the present invention.

Structure. FIG. 2 is a cross sectional view showing a microcarrier 30 and a substrate 20 interconnected, one with the other, by an array of metal balls 24 placed on a contact array of either a microcarrier surface 32 or a substrate surface 22. The metal balls provide significant height to the contact array to mediate TCE mismatch that may occur when dissimilar materials used for the microcarrier and the substrate are subjected to thermal cycling. Additionally, the large gap between the microcarrier and the substrate afforded by the metal balls permits ready and effective cleaning of the solder bonds formed when the microcarrier and substrate are joined by reflow or other such techniques.

Figure 3:
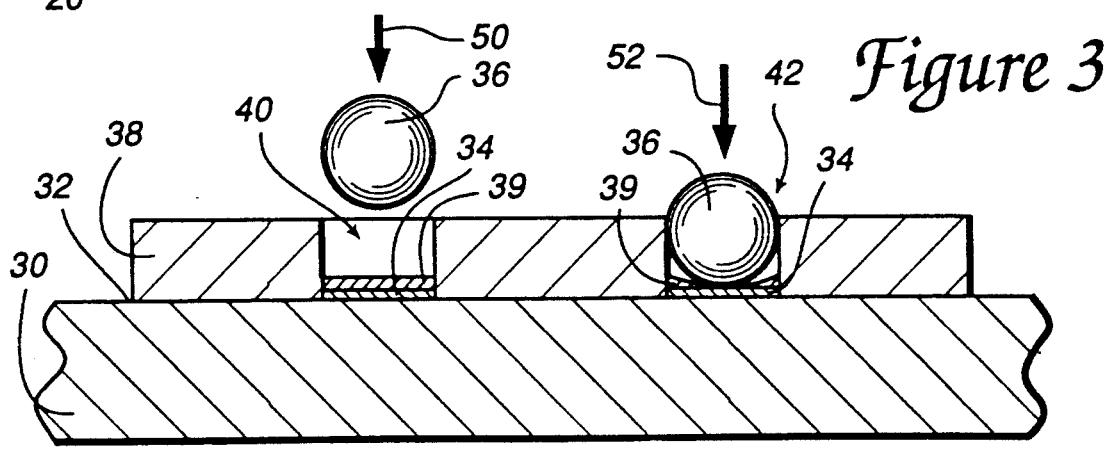
FIG. 3 is a cross sectional view showing a process for forming an interconnect array for a microcarrier according to the present invention.

Process Flow. FIG. 3 is a cross sectional view showing a process for forming an interconnect array for a microcarrier according to the present invention. A typical process flow for a preferred embodiment of the invention is as follows:

1. Carriers With Pads. Design and fabricate a microcarrier 30 having an interconnect surface 32 on which metal pads 34 are formed using standard techniques (the microcarrier may be made of any suitable material, including ceramics, printed circuit boards, or Cu/Pl on ceramic or metal substrates).

2. Chip Assembly. Assemble microcarrier and integrated circuit using standard techniques, e.g. wire bonding, TAB, etc.

3. Apply Solder Paste. Print solder paste 39 onto the metal pads using screen or stencil techniques.

4. Apply Solder Balls. Place solder balls 36 of the correct diameter, having a variance not greater than ±0.125 mm (5 mils), onto the microcarrier metal pads 34 using a tool 38, such as a stencil, etc., having appropriate openings 40 (shown in FIG. 3 by the arrow 50).

5. Compact and Heat. Level the solder balls using a flat plate and apply heat to reflow the solder paste (shown in FIG. 3 by the arrow 52). This leveling pushes the solder balls into the solder paste from a common plane (i.e. the plane of the flat plate) and thereby compensates for variations in solder ball size. The interconnect contacts 42 thus formed contract upon cooling, allowing the tool to be removed without damage to the contacts.

6. Board Assembly. Print solder paste to metal pads on the substrate using screen or stencil techniques.

7. Joining. Align the microcarrier with the printed circuit board and press the microcarrier and printed circuit board together, forcing the solder balls formed on the microcarrier into the solder paste on the printed circuit board.

8. Solder. Reflow the microcarrier and printed circuit board assembly in a furnace.

Process steps 3. and 5. above, printing solder paste onto the carrier metal pads and then leveling the solder balls using a flat plate, accommodates size variations present in the solder balls, as well as compensating for lack of coplanarity between the microcarrier and the printed circuit board. In the preferred embodiment of the invention, the step of leveling the solder balls is performed in situ during the furnace reflow of solder balls onto the microcarrier. Leveling may also be accomplished by use of a flat non-wettable plate (the plate need not be metal).

When the microcarrier is joined to the printed circuit board, the solder paste printed on the board, in addition to joining the microcarrier to the circuit board, serves two other purposes: It adheres the microcarrier to the printed circuit board before final assembly is performed; and it provides a cushion of tolerance to compensate for height variations present in the solder balls and the result from lack of coplanarity between the microcarrier and the printed circuit board. Thus, the use of solder paste is analogous to the use of mortar to set and level a row of bricks.

If the weight of the microcarrier is insufficient, such that it "floats" when the solder on the metal pad is molten, a additional weight may be placed on the microcarrier during reflow to assure that all electrical contacts in the microcarrier contact array make good contact to the contact array on the printed circuit board.

A temperature hierarchy is necessary when choosing the composition of the solder paste and the solder ball. In the preferred embodiment of the invention, the composition of the solder paste is the standard composition used in surface mount processing, i.e. 60Pb40Sn, or any variation thereof, having a reflow temperature of about 240° C.

The solder balls may be selected from materials having the same composition of those of the solder paste. If the same materials are chosen for the solder paste and the solder balls, such that both the solder paste and solder balls have the same melting temperature, it becomes necessary to depend on the surface tension of the solder to support the microcarrier during reflow. Accordingly, in the preferred embodiment of the invention, e.g. where a heavier microcarrier is to be supported during reflow, the solder used for the solder balls has a higher melting temperature than that of the solder used for the solder paste. If the reaction between the two solders (the melting together of the solders) is sufficient at reflow temperature, the maximum microcarrier weight that is to be supported by the joint during reflow must be limited or the contact array could collapse.

In an alternative embodiment of the present invention, it is possible to support heavier microcarriers by using a barrier metal, such as nickel, to add rigidity to the solder ball during solder reflow. In this embodiment of the invention, the solder balls are coated with a thin layer of nickel (preferably several microns thick), using electro- or electroless- nickel plating. The nickel plating step may be performed as a batch process step, such that the incremental cost of this step is minimal.

Forming the solder balls with a barrier metal coating prevents reaction between the two types of solder (i.e. that of the solder paste and the solder ball), such that even the same type of solder could be used for both the solder paste and the solder balls.

Barrier metal plating also allows the solder balls to keep their characteristic shape during reflow, which produces an interconnect array having a desired shape, e.g. a microsphere shape, etc. Thus, if an interconnect array in which each contact has a spherical shape is preferred, and a barrier metal layer of sufficient thickness is applied to the solder balls, the spherical shape may be maintained during reflow, even if a higher soldering temperature is used.

The addition of a metal barrier, such as nickel or copper, to the solder balls also provides an interconnect array that benefits from the use of such higher temperature metals. That is, the interconnect array exhibits superior mechanical strength, while the lower joint fatigue life associated with the use of such metals is reduced or eliminated by the use of plastic solder in the majority of the joint.

In some embodiments of the present invention, a solid metal ball, formed from such metals as nickel or copper, is substituted for the solder ball. The solid metal ball is adhered to each bond surface (that of the microcarrier and the substrate) by the solder paste during reflow. The resulting structure provides excellent support qualities while providing significant increase in contact height.

The present invention makes it possible to achieve an attractive high density, high performance, scalable package. Microcarriers formed in accordance with the present invention can be used for a wide range of applications, including: very low I/O count carriers ($\approx$20 to 30 connections) for memory packaging, where printed circuit boards or ceramics are used for the carrier; mid I/O count carriers (100–350 connections), where printed circuit boards or ceramics are used for the carrier; and very high I/O count carriers for VLSI packaging (>350 to 2000 connections), where printed circuit boards, ceramics, and Cu/PI are used for the carrier.

The present invention allows the microcarrier material to be chosen from any material currently available, based on design considerations for the intended applications, such as I/O, frequency, power dissipation, cost, and routing density. The substrate may be chosen for the same reasons.

The present invention allows the designer maximum flexibility in choice of materials by solving worst case matching of the microcarrier to the substrate (e.g. ceramic carrier on printed circuit board, or printed circuit board carrier on ceramic, e.g. such as are preferred for memory applications, where reduction of lead count can improve device performance). The present invention provides a very low defect rate manufacturing process, having a low cost of manufacture. This advantage is gained in part by providing higher tolerance to variations in solder ball height.

The invention also allows preshaping of solder joints (for example of cylindrical solder pins), while maintaining these shapes after reflow. According to this aspect of the invention, it is possible to cast any shape interconnect array contact desired. For example, a tool consisting of an array of individual molds may be provided in which some contacts have different shapes, such as may be used for locating, etc. Additionally, the invention allows the use of molten solder in place of the solder balls. Accordingly, a tool may be affixed to a microcarrier, or an array of microcarrier to expedite production, and solder is placed in, and then melted in the individual molds in the tool. An interconnect array is thus formed directly on the microcarrier using readily available materials and otherwise standard practices.

Although the invention is described herein with reference to the preferred embodiment, one skilled in the art will readily appreciate that other applications may be substituted for those set forth herein without departing from the spirit and scope of the present invention. For example, the interconnect array could also be formed on the substrate instead of on the microcarrier. According to this embodiment of the invention, several interconnect arrays could be formed on the substrate at the same time. Standard microcarriers may be used to complete the assembly. Accordingly, the invention should only be limited by the claims included below.

We claim:

1. A microcontact spacer for providing mechanical and electrical interconnection between a carrier and a substrate, comprising:

a microsphere formed of at least one solder ball surrounded by a barrier metal coating, wherein the barrier metal coating retains the shape of the solder ball and the solder ball mediates thermal stress between the carrier and the substrate.

2. The microcontact spacer of claim 1, wherein said barrier metal coating is selected from one of plated nickel or copper.

3. The microcontact spacer of claim 1, wherein said microcontact is formed on a printed solder paste pad.

4. The microcontact spacer of claim 1, wherein said microcontact is formed on said substrate.

5. The microcontact spacer of claim 1, wherein said microcontact is formed on said carrier.

6. The microcontact spacer of claim 1, wherein said substrate and said carrier are formed of dissimilar materials.

7. A microcontact spacer for providing mechanical and electrical interconnection between a carrier and a substrate, comprising:

a microsphere formed of at least one solder ball, wherein said microcontact is formed by joining said microsphere to a printed solder paste pad, and wherein said solder paste melts at a different temperature than said microsphere.

* * * * *